United States Patent
Rolda, Jr. et al.

(10) Patent No.: US 7,259,043 B2
(45) Date of Patent: Aug. 21, 2007

(54) CIRCULAR TEST PADS ON SCRIBE STREET AREA

(75) Inventors: Ruben A. Rolda, Jr., Baguio (PH); Richard Valerio, Marikina (PH); Jenny OLero, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 157 days.

(21) Appl. No.: 10/145,442

(22) Filed: May 14, 2002

(65) Prior Publication Data

US 2003/0215966 A1   Nov. 20, 2003

(51) Int. Cl.
*H01L 21/00* (2006.01)
(52) U.S. Cl. .................. 438/113; 438/114
(58) Field of Classification Search .......... 438/113, 438/114
See application file for complete search history.

(56) References Cited

U.S. PATENT DOCUMENTS

| | | | | |
|---|---|---|---|---|
| 3,795,973 A | * | 3/1974 | Calhoun | 438/6 |
| 4,751,458 A | * | 6/1988 | Elward, Jr. | 324/754 |
| 4,835,592 A | * | 5/1989 | Zommer | 257/620 |
| 5,003,374 A | * | 3/1991 | Vokoun, III | 174/255 |
| 5,024,970 A | * | 6/1991 | Mori | 438/462 |
| 5,059,899 A | * | 10/1991 | Farnworth et al. | 438/18 |
| 5,096,855 A | * | 3/1992 | Vokoun, III | 438/462 |
| 5,126,286 A | * | 6/1992 | Chance | 438/462 |
| 5,206,181 A | * | 4/1993 | Gross | 438/18 |
| 5,214,657 A | * | 5/1993 | Farnworth et al. | 714/767 |
| 5,334,857 A | * | 8/1994 | Mennitt et al. | 257/48 |
| 5,366,906 A | * | 11/1994 | Wojnarowski et al. | 438/17 |
| 5,477,062 A | * | 12/1995 | Natsume | 257/48 |
| 5,635,424 A | * | 6/1997 | Rostoker et al. | 438/612 |
| 5,665,655 A | * | 9/1997 | White | 438/584 |
| 5,706,178 A | * | 1/1998 | Barrow | 361/777 |
| 5,731,222 A | * | 3/1998 | Malloy et al. | 438/113 |
| 5,759,910 A | * | 6/1998 | Mangold et al. | 438/613 |
| 5,834,829 A | * | 11/1998 | Dinkel et al. | 257/620 |
| 5,981,370 A | * | 11/1999 | Rincon et al. | 438/612 |
| 5,986,460 A | * | 11/1999 | Kawakami | 324/765 |
| 6,027,859 A | * | 2/2000 | Dawson et al. | 430/312 |
| 6,046,101 A | * | 4/2000 | Dass et al. | 438/624 |
| 6,121,677 A | * | 9/2000 | Song et al. | 257/692 |
| 6,127,196 A | * | 10/2000 | Butera et al. | 438/15 |

(Continued)

FOREIGN PATENT DOCUMENTS

JP      2002373924 A   * 12/2002

*Primary Examiner*—David E. Graybill
(74) *Attorney, Agent, or Firm*—Yingsheng Tung; Wade James Brady, III; Frederick J. Telecky, Jr.

(57) ABSTRACT

A semiconductor wafer design and process having test pads (36) reducing cracks generated during the wafer saw process from extending into and damaging adjacent die. The present invention provides a plurality of circular test pads (36) in a wafer scribe street (34) such that any cracks generated in the test pad during wafer saw self terminate in the periphery of the circular test pad. By providing a curved test pad periphery, cracks will tend to propagate along the edges of the test pads and self terminate therein. The circular test pads avoid any sharp corners as is conventional in rectangular test pads which tend to facilitate the extension of cracks from corners to extend into the adjacent wafer die (32). The present invention utilizes existing semiconductor fab processing and utilizes new reticle sets to define the curved test pads.

1 Claim, 3 Drawing Sheets

U.S. PATENT DOCUMENTS

| | | | |
|---|---|---|---|
| 6,133,134 A * | 10/2000 | Mehr | 438/612 |
| 6,166,556 A * | 12/2000 | Wang et al. | 324/765 |
| 6,192,289 B1 * | 2/2001 | Geffen et al. | 700/121 |
| 6,249,114 B1 * | 6/2001 | Sakai | 324/72.5 |
| 6,268,568 B1 * | 7/2001 | Kim | 174/250 |
| 6,271,578 B1 * | 8/2001 | Mitwalsky et al. | 257/620 |
| 6,330,166 B1 * | 12/2001 | Aoyama et al. | 361/760 |
| 6,352,940 B1 * | 3/2002 | Seshan et al. | 438/762 |
| 6,365,443 B1 * | 4/2002 | Hagiwara et al. | 438/130 |
| 6,399,400 B1 * | 6/2002 | Osann et al. | 438/14 |
| 6,525,422 B1 * | 2/2003 | Ono et al. | 257/737 |
| 6,542,377 B1 * | 4/2003 | Fisher et al. | 361/777 |
| 6,582,085 B2 * | 6/2003 | Kosugi | 257/620 |
| 6,768,062 B2 * | 7/2004 | Morimoto et al. | 174/260 |
| 2002/0050629 A1 * | 5/2002 | Seshan et al. | 257/632 |
| 2002/0076966 A1 * | 6/2002 | Carron et al. | 439/330 |
| 2003/0094966 A1 * | 5/2003 | Fang | 324/765 |

* cited by examiner

```
         50
         ↙
┌─────────────────┐
│ FABRICATE WAFER WITH │
│  ROUND TESTPADS  │
└─────────────────┘
         │
         ▼
┌─────────────────┐
│ SAW WAFER ALONG │
│   SCRIBE STREET │
└─────────────────┘
```

CIRCULAR TEST PADS ON SCRIBE STREET AREA

FIELD OF THE INVENTION

The present invention is generally related to semiconductor wafer processing, and more particularly to scribe streets extending between formed active areas and test pads located thereon for testing the active devices.

BACKGROUND OF THE INVENTION

Integrated circuits are typically defined on a semiconductor wafer using a variety of wafer fab processes. Each of the formed active circuit areas, later forming integrated circuits after dicing and packaging, are physically separated from one another on the wafer by an elongated region commonly referred to as a scribe street. These wafers are typically cut along the scribe street after circuit testing using a conventional saw process.

In addition to the active circuitry formed on the semiconductor wafer, test pads are also provided to facilitate the active testing of the formed circuitry prior to the wafer saw process. Typically, these test pads are formed in the scribe streets, and are cut away during the wafer saw process after the wafer level die test.

Referring to FIG. 1, there is shown at 10 a portion of a fabricated semiconductor wafer having a plurality of active circuit areas 12, commonly referred to as die, each being separated from one another by an elongated scribe street 14. Defined within these scribe streets 14 are a plurality of rectangular test pads 16, which test pads may be electrically connected to one or more of the adjacent die 12 to permit wafer level die testing using conventional test equipment. This test equipment, such as via electrical probes, provides signals to and analyzes signals from the test pad 16 to electrically operate and test the functionality of the respective die 12 at the wafer level. Conventionally, these test pads 16 have square profiles and are defined using conventional reticle sets.

With the improvements in silicon technology, scribe street widths are being shrunk to increase the number of chips per wafer that can be manufactured at wafer fab. Referring to FIG. 2, this reduction in scribe street width has reduced the distance from the sawing line 18 to the active circuitry 12 of the die. Accordingly, even slight propagation of cracks in the scribe street formed during the wafer saw process eventually results in damaged circuitry since the design of conventional test pads does not prevent them from extending into the active circuitry area 12, as depicted in FIG. 2. As shown at 20, the wafer saw process typically generates cracks in the scribe street which extend along an edge and from a corner of the square test pad 16 and further extend into the die 12. These cracks render the particular die 12 non-functional, thus reducing the overall yield of the die which can be fabricated from the wafers.

FIG. 3 depicts an actual wafer after wafer saw along the scribe street 18, whereby cracks 16 are generated which extend outward from the corner of the original test pads and into the active circuitry 12. As can be appreciated in FIG. 3, the cracks are irregular, some extending into the active die area 12, and others not. However, with the continued reduction in scribe street widths with the introduction of new technologies, and in an effort to maximize wafer yield, these cracks are becoming an increasing problem and a reduction in wafer yield.

It is desired that an improved wafer fab design of the test pads 16 and process which reduces the generation of cracks during wafer saw which damage active circuit areas, and increases wafer yield.

SUMMARY OF THE INVENTION

The present invention achieves technical advantages as a wafer design and process utilizing circular test pads on the scribe street such that any cracks generated in the circular test pad self terminate along the edge of the circular test pad, thereby increasing wafer yield.

According to the present invention, the test pads are designed to have a curved profile, and preferably a round periphery. Advantageously, as this round test pad is cut during wafer saw, the cracks will not extend from a sharp corner into the active die, such as is typical with the square test pads conventionally provided. Advantageously, this solution is straight forward, and does not require any major change in the wafer fab process. Rather, only reticle sets will be replaced, and no additional wafer fab steps are introduced. In addition, this solution does not require a huge amount of investment to eliminate a potential problem at wafer saw in the assembly packaging site as we move to narrowed scribe street design.

The present invention reduces yield loss at wafer saw due to cracks propagating towards the active circuitry of the die. The present invention reduces reliability risks since cracks that have initiated from the sawing process will eventually be stopped by the design of the test pads.

DETAILED DESCRIPTION OF THE PREFERRED EMBODIMENT

Figure 4:
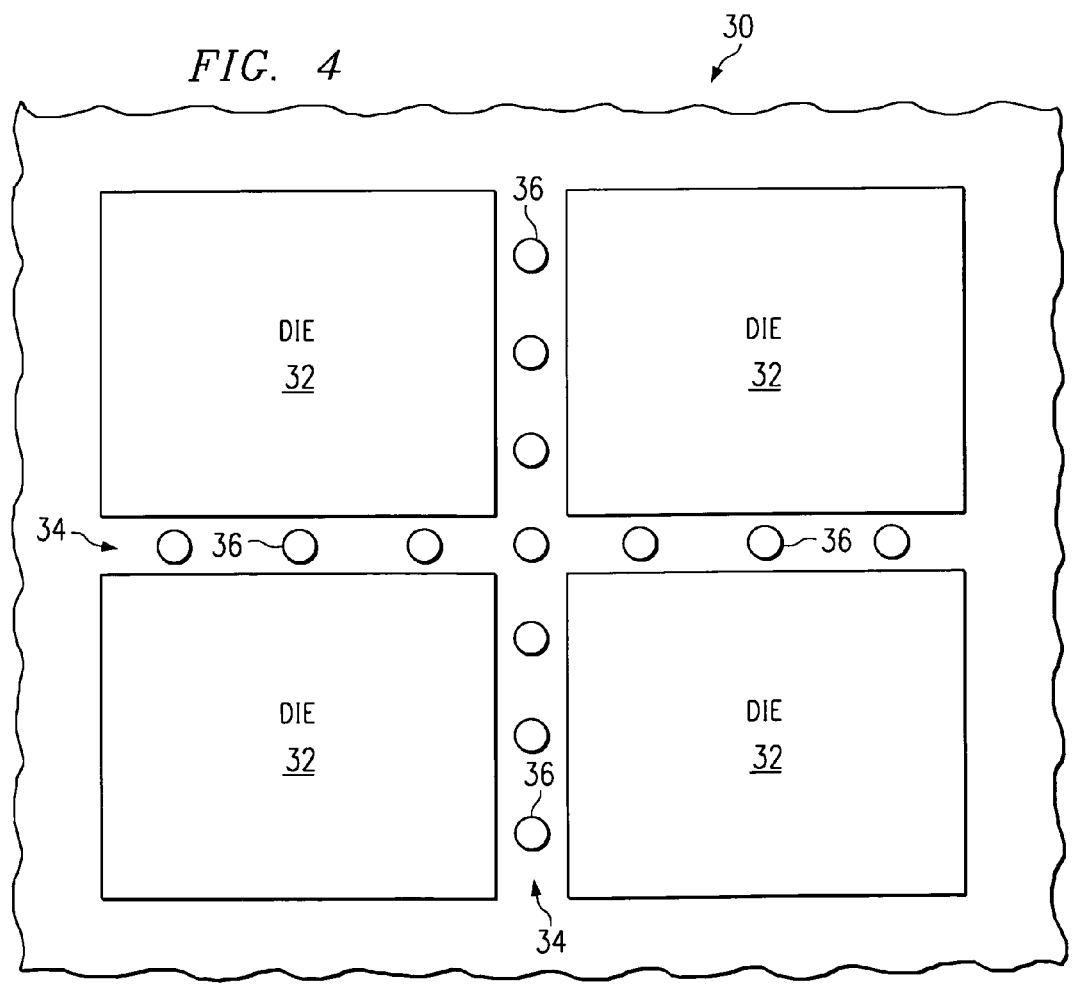
FIG. 4 is a top view of the present invention seen to include a semiconductor wafer having circular test pads defined in the scribe street which reduce the possibility of cracks being formed therefrom extending into active circuit areas, thus increasing wafer yield.

Referring now to FIG. 4, there is depicted at 30 a semiconductor wafer having a plurality of active circuits 32 (die) being formed upon the semiconductor wafer according to conventional semiconductor wafer fab processing. Defined in two dimensions between each of the formed die 32 are elongated scribe streets, generally shown at 34. Scribe streets 34 provide physical and electrical separation between the die 32, and are later cut using a wafer saw process to separate the active die for subsequent packaging.

Advantageously, as shown in FIG. 4, a plurality of test pads 36 are provided in the scribe street area 34 which have the curved profile, preferably shown as having a round periphery, as shown, but which could have other curved peripheries, such as oval or elliptical. Each of these test pads is electrically connected to one or more of the adjacent die 32, and provide a suitable electrical connection point for test equipment (not shown) to electrically test and operate the adjacent die, allowing functional testing of the die at the wafer level. Test pads 36 have a sufficient surface area such that remote test equipment probes can electrically engage these test pads as needed during die testing.

Figure 1:
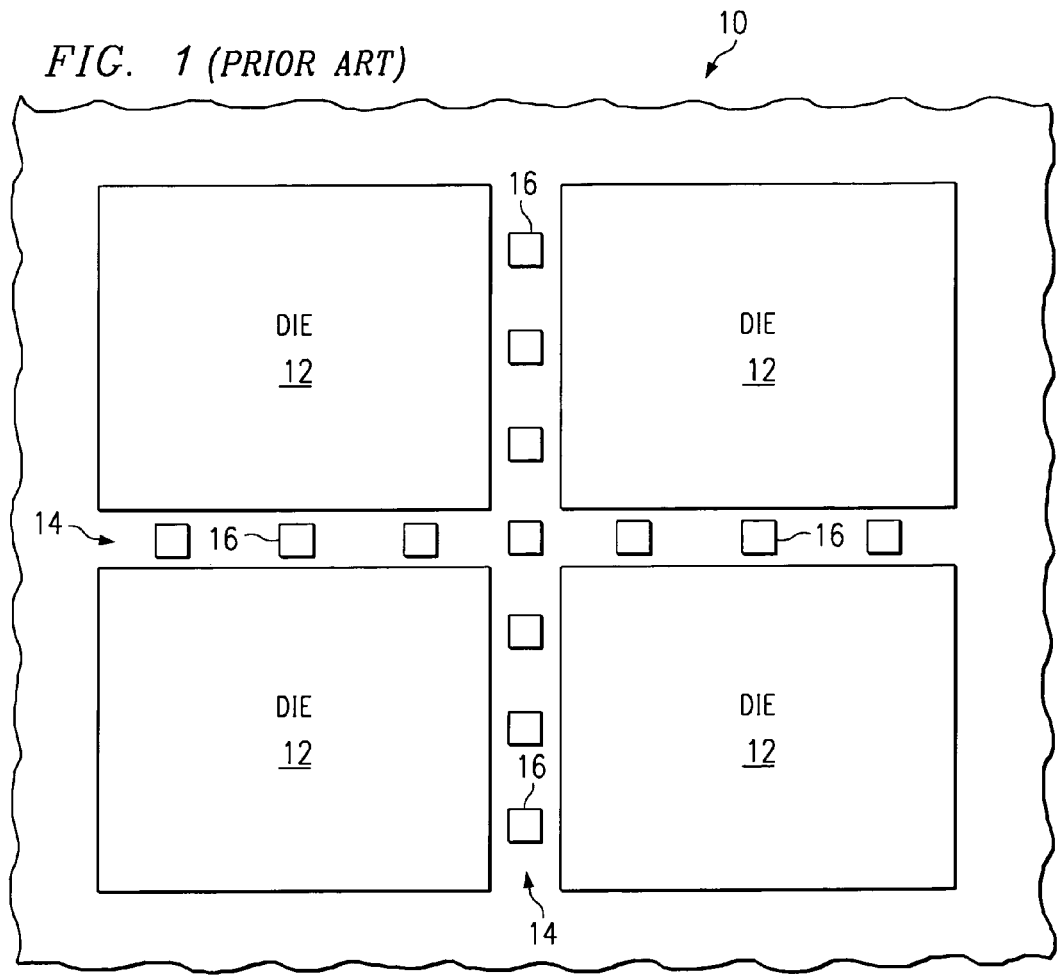
FIG. 1 is a top sectional view of a conventional semiconductor wafer having formed thereon a plurality of active circuit regions separated by scribe streets and having defined in the scribe streets a plurality of rectangular test pads.
Figure 2:
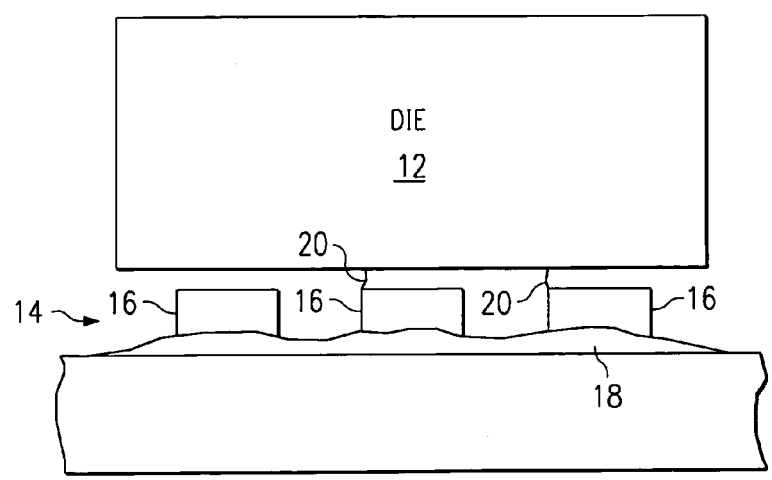
FIG. 2 is a top view of a scribe street after wafer saw depicting cracks formed in the wafer saw process extending from a corner of the rectangular test pad into an adjacent die thus reducing yield.
Figure 3:
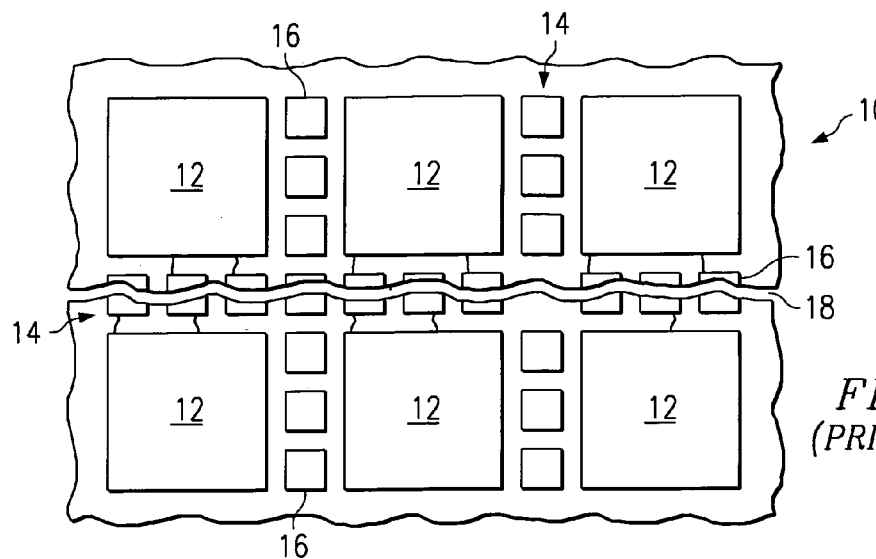
FIG. 3 is a depiction of a wafer after the scribe street has been sawed depicting cracks to be irregularly formed, with some extending into and damaging adjacent die.
Figures 5, 6:
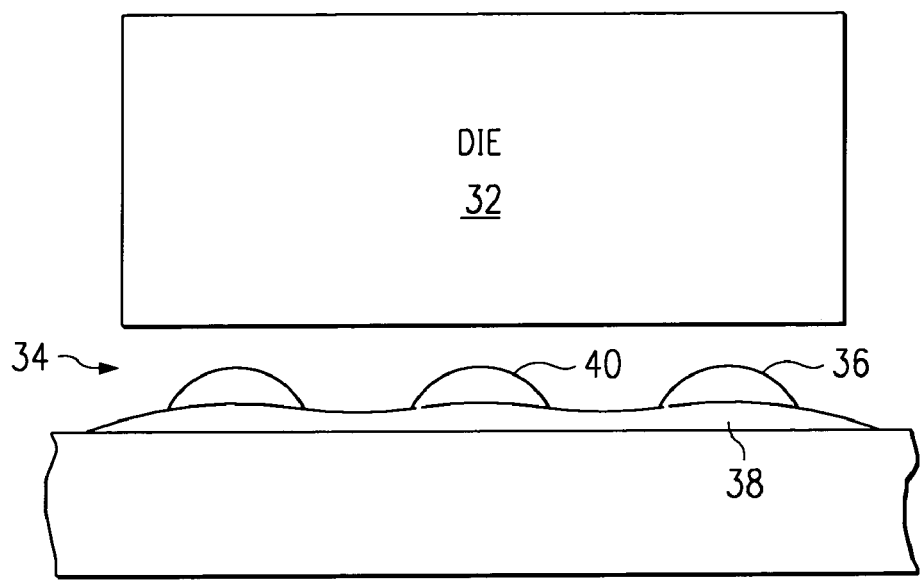
FIG. 5 is a view of the scribe street after a wafer saw through the circular test pads illustrating that any cracks will propagate and follow the edges of the circular test pads and self terminate therein.
FIG. 6 is the process flow of one embodiment of the invention.

Referring now to FIG. 5, there is depicted the wafer scribe street 34 after a wafer saw process with the cut line being shown generally at 38. It can be appreciated in FIG. 5 that any cracks developed in the circular test pad 36 will propagate and follow the edges of the round test pad 36, and self terminate along this curved surface, rather than extending into the adjacent die 32 which would otherwise damage the die, as previously discussed in regards to FIGS. 1-3. Advantageously, cracks extending along a curved surface, shown at 40, tend to follow the curved surface and will self terminate along the curved surface, rather than extending thru the saw street into the adjacent die 32. Thus, the present invention provides a test pad geometry that overcomes the tendencies of cracks generated in the saw street to branch out and damage adjacent active circuitry. While a round periphery is shown and preferred in the preferred embodiment, it is envisioned other curved profiles could be provided, such as elliptical test pads if desired. The present invention takes advantage of the curved periphery such that no sharp corners are provided in the pad periphery which tend to allow the extension of a crack away from the test pad and into the adjacent die 32, as is conventionally experienced.

This present invention is straight forward, and does not require any major change in the wafer fab process. Rather, only the reticle sets utilized to define the test pads are changed, and no additional wafer fab processes are introduced, as shown in FIG. 6. The present invention does not require a huge amount of investment, and eliminates a potential problem at wafer saw in the assembly packaging site as technologies move to narrower scribe street designs.

The present invention advantageously prevents yield loss at wafer saw due to cracks which otherwise tend to propagate towards the active circuitry of the die. The present invention reduces reliability risks since cracks that have been initiated from the sawing process will eventually self terminate in the edges of the test pads of the present design.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A device, comprising;
    an integrated circuit die having an edge defined by a scribe street;
    a plurality of test pads on the scribe street, each having at least a partially solid round or elliptical disk shape and no openings in the middle;
    saw cracks in said scribe street terminating in said test pads; and
    the integrated circuits die free of saw cracks at the edge.

* * * * *